United States Patent
Lu et al.

(10) Patent No.: US 7,309,632 B1
(45) Date of Patent: Dec. 18, 2007

(54) METHOD FOR FABRICATING A NONVOLATILE MEMORY CELL

(75) Inventors: Wei-Bo Lu, Hsinchu County (TW); Dah-Chuan Chen, Hsinchu County (TW)

(73) Assignee: Powerchip Semiconductor Corp., Science Park, Hsin-Chu (TW)

( * ) Notice: Subject to any disclaimer, the term of this patent is extended or adjusted under 35 U.S.C. 154(b) by 0 days.

(21) Appl. No.: 11/735,440

(22) Filed: Apr. 14, 2007

(51) Int. Cl.
*H01L 21/8247* (2006.01)

(52) U.S. Cl. .............................. 438/259; 257/E21.179

(58) Field of Classification Search ........ 438/257–267; 257/E21.179
See application file for complete search history.

(56) References Cited

U.S. PATENT DOCUMENTS

| 5,110,753 A * | 5/1992 | Gill et al. ............... 438/262 |
| 2004/0188751 A1 * | 9/2004 | Lin ............................. 257/315 |
| 2007/0059898 A1 * | 3/2007 | Shin et al. ............... 438/424 |

* cited by examiner

*Primary Examiner*—Richard A. Booth
(74) *Attorney, Agent, or Firm*—Winston Hsu

(57) ABSTRACT

A method of fabricating a nonvolatile memory cell includes providing a substrate with a trench, with a sidewall where a tunnel oxide layer and a floating gate are successively formed, forming a control gate in the trench, performing a high density plasma deposition process to form an HDP oxide layer on the top surface of control gate.

13 Claims, 13 Drawing Sheets

METHOD FOR FABRICATING A NONVOLATILE MEMORY CELL

BACKGROUND OF THE INVENTION

1. Field of the Invention

The present invention relates to a method for fabricating a memory cell, and more particularly, to a nonvolatile memory cell.

2. Description of the Prior Art

Because a nonvolatile memory cell is rewritable and has qualities as fast transfer and low power consumption, it has been widely applied to portable products and become a critical device of many information, communication, and consuming electronic products. However, in order to provide light electronic products with high quality, it has become important for the current information industry and memory manufacturers to increase the device integration and quality of the nonvolatile memory cells.

Please refer to FIG. 1. FIG. 1 is a schematic diagram of the structure of a memory cell 10 according to the prior art. The memory cell 10 is disposed on a substrate 12, and comprises a control gate 14 in a trench 26 on the substrate 12, a floating gate 16 disposed on the two sides of the control gate 14, at least a dielectric layer 18 placed between the control gate 14 and the floating gate 16, a cap layer 20 placed above the control gate 14, two word lines 22 and spacers 24 placed on the outer sides of the floating gate 16. The cap layer 20 comprises the function of protecting the control gate 14. According to the prior art, the thermal oxidation process is used to grow oxide materials on the top surface of the polysilicon control gate 14. However, due to the continuous increase of the device integration, the critical dimension (CD) of a single memory cell has to be continuously shrunk. Therefore, the difficulty of forming the sufficient thickness of the cap layer 20 on the top surface of the control gate 14, such as 600 angstroms (Å), increases dramatically according to the prior art method. Please refer to Table 1. Table 1 is the relationship table of the critical dimension of the trench 26 and the thickness of the cap layer 20.

TABLE 1

| Critical dimension of the trench (Å) | 1860 | 1490 | 1350 |
|---|---|---|---|
| Thickness of the cap layer (Å) | 676 | 516 | 435 |

Therefore, as indicated in Table 1, while the critical dimension of the memory cell 10 is getting smaller and smaller, the thickness of the cap layer 20 fabricated according to the prior art method is also getting thinner and thinner and becomes insufficient for protecting the control gate 14. This situation caused the difficulties in the fabrication or the unsatisfied quality of the memory cells 10, resulted in a bottleneck of the improvement of the integration of the nonvolatile memory cell.

In addition, while improving the device integration, the shrinking dimension of the control gate 14 will increase its resistivity. In order to solve the problem of resistivity, manufacturers considered using metal or other conductive materials to replace traditional polysilicon materials for fabricating the control gate 14. However, when metal materials are used to form the control gate 14, it is more difficult to form the required cap layer 20 on the control gate 14 through the traditional thermal oxidation process. As mentioned above, the industry needs to find other methods to replace the traditional thermal oxidation process to fabricate the cap layer 20 for ensuring the quality of the memory cell 10.

SUMMARY OF THE INVENTION

It is a primary objective of the claimed invention is to provide a method to fabricate the cap layer of a nonvolatile memory cell by using a high density plasma (HDP) process in order to solve the problems of the prior art methods, such as the insufficient thickness of the cap layer due to the shrinking dimension of the device.

According to the claimed invention, a method of fabricating a nonvolatile memory cell comprises providing a substrate with a trench, with a sidewall where a tunnel oxide layer and a floating gate are successively formed, forming a control gate in the trench, performing a HDP deposition process to form an HDP oxide layer on the top surface of the control gate.

It is an advantage of the claimed invention that the HDP deposition process is utilized to fabricate the cap layer of a nonvolatile memory cell, so that the thickness of the cap layer shall not be affected as the critical dimension of the nonvolatile memory cell is reduced. As a result, an HDP oxide layer with a sufficient thickness can be formed as the cap layer on the control gate to provide a nonvolatile memory cell with good quality.

These and other objectives of the present invention will no doubt become obvious to those of ordinary skill in the art after reading the following detailed description of the preferred embodiment that is illustrated in the various figures and drawings.

Table 1 is a relationship table of the critical dimension of the trench and the cap layer of a memory cell.

DETAILED DESCRIPTION

Figure 1:
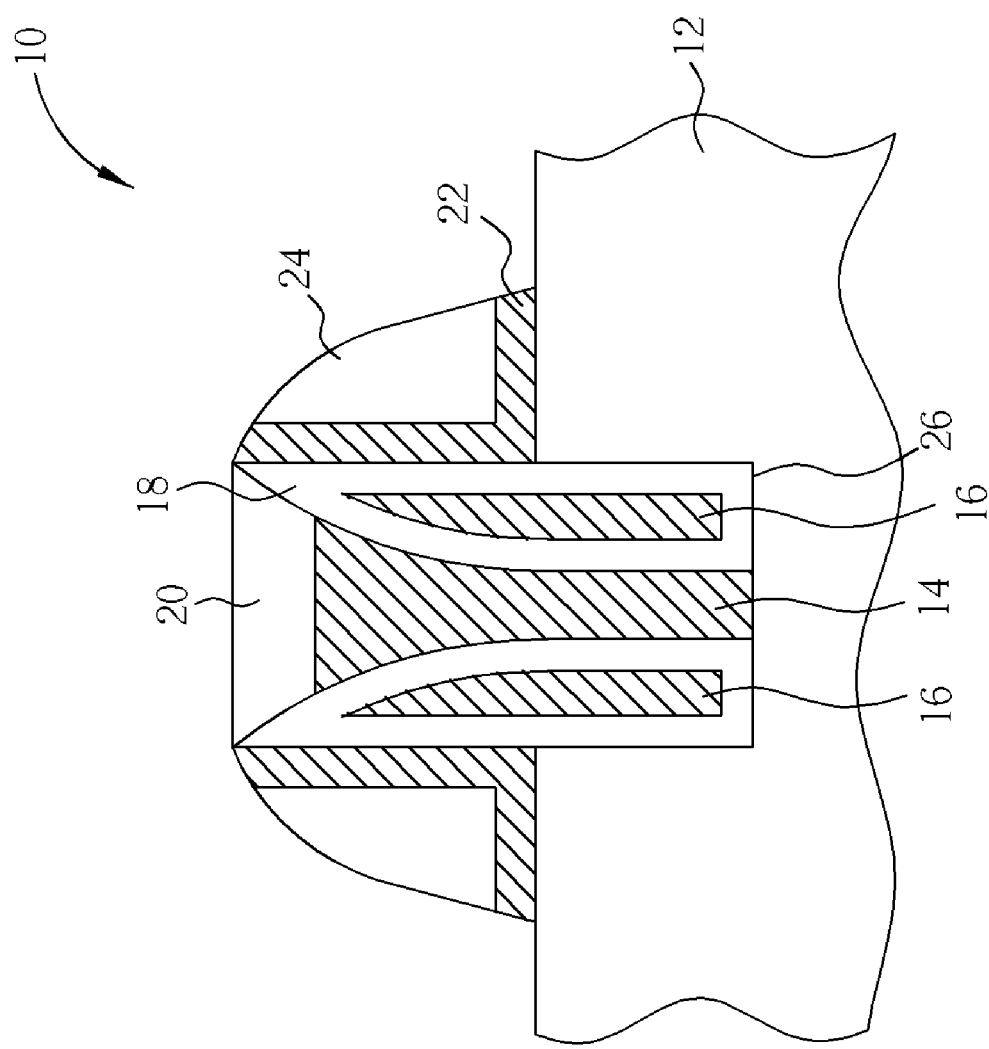
FIG. 1 is a cross-section schematic diagram of a nonvolatile memory cell according to the prior art.
Figure 2:
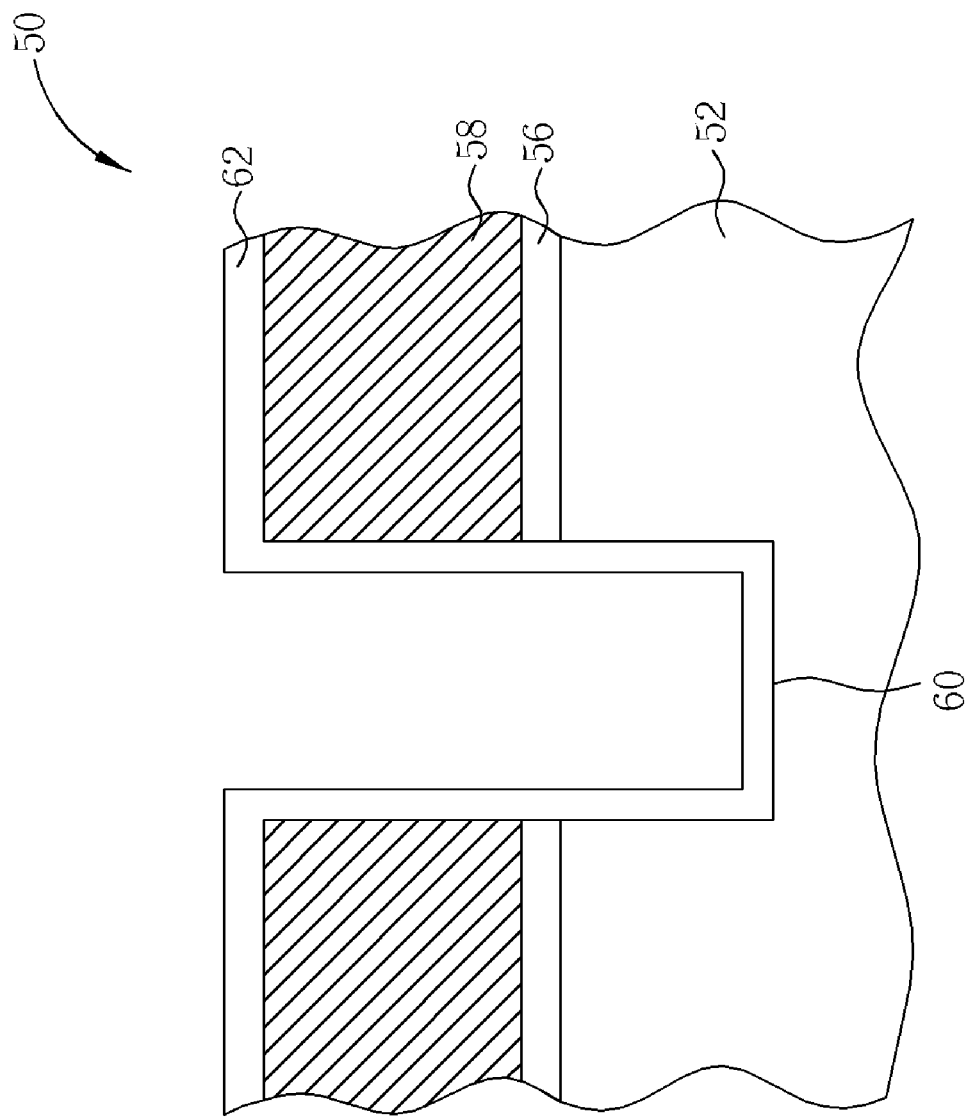
FIGS. 2-13 are schematic diagrams of the fabrication process of a nonvolatile memory cell according to the present invention.

Please refer to FIGS. 2-13. FIGS. 2-13 are schematic diagrams of the process of fabricating a nonvolatile memory cell 50 according to the present invention. As indicated in FIG. 2, at first a substrate 52 is provided, such as a semiconductor substrate containing silicon materials. A pad layer 56 and a mask layer 58 are disposed on the substrate 52. The material of the mask 58 may be silicon nitride (SiN), silicon carbide (SiC), or silicon carbide nitride (SiCN). A trench 60 is formed by a lithography-etching process through removing portions of the mask layer 58, the pad layer 56, and the substrate 52. Next, a tunnel oxide layer 62 is formed on the substrate 52 covering the surface of the trench 60.

Figure 3:
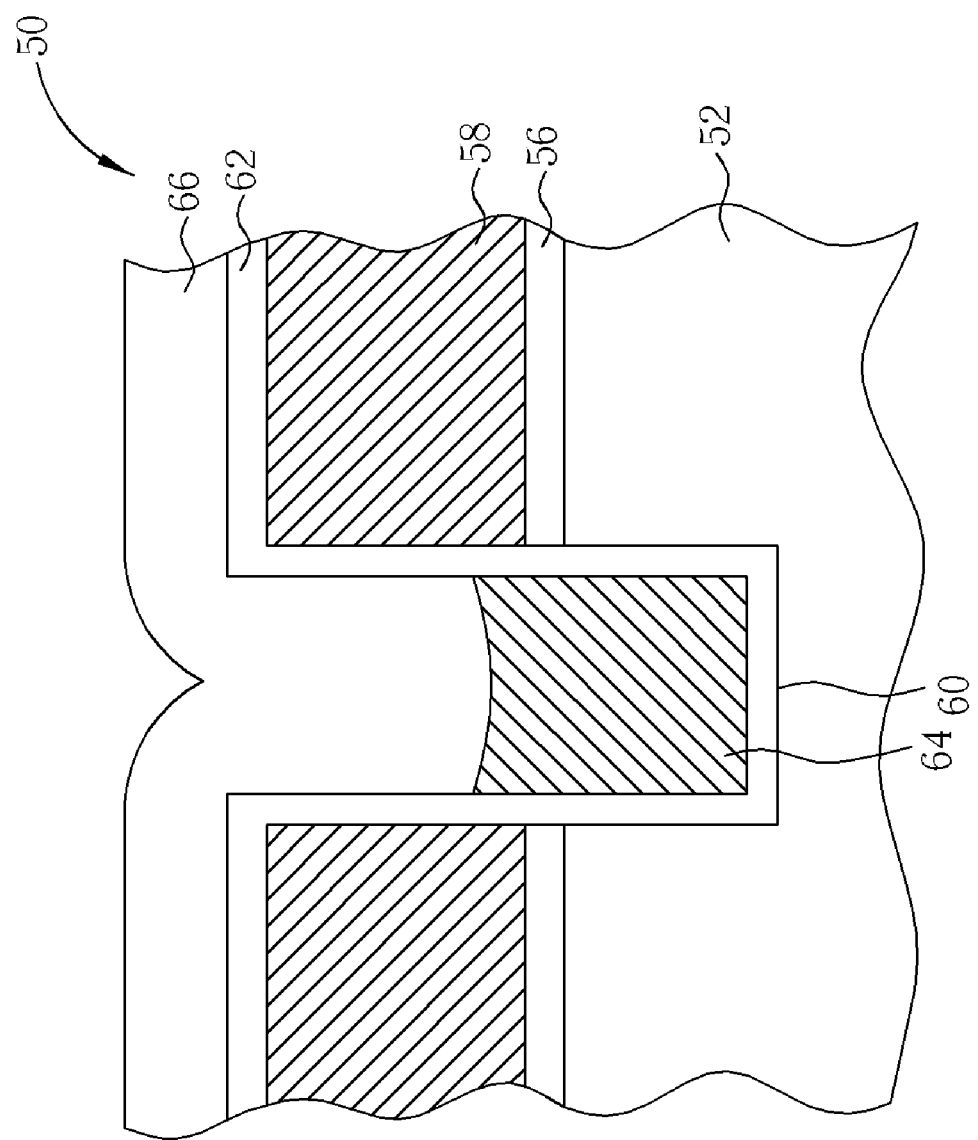
Figure 4:
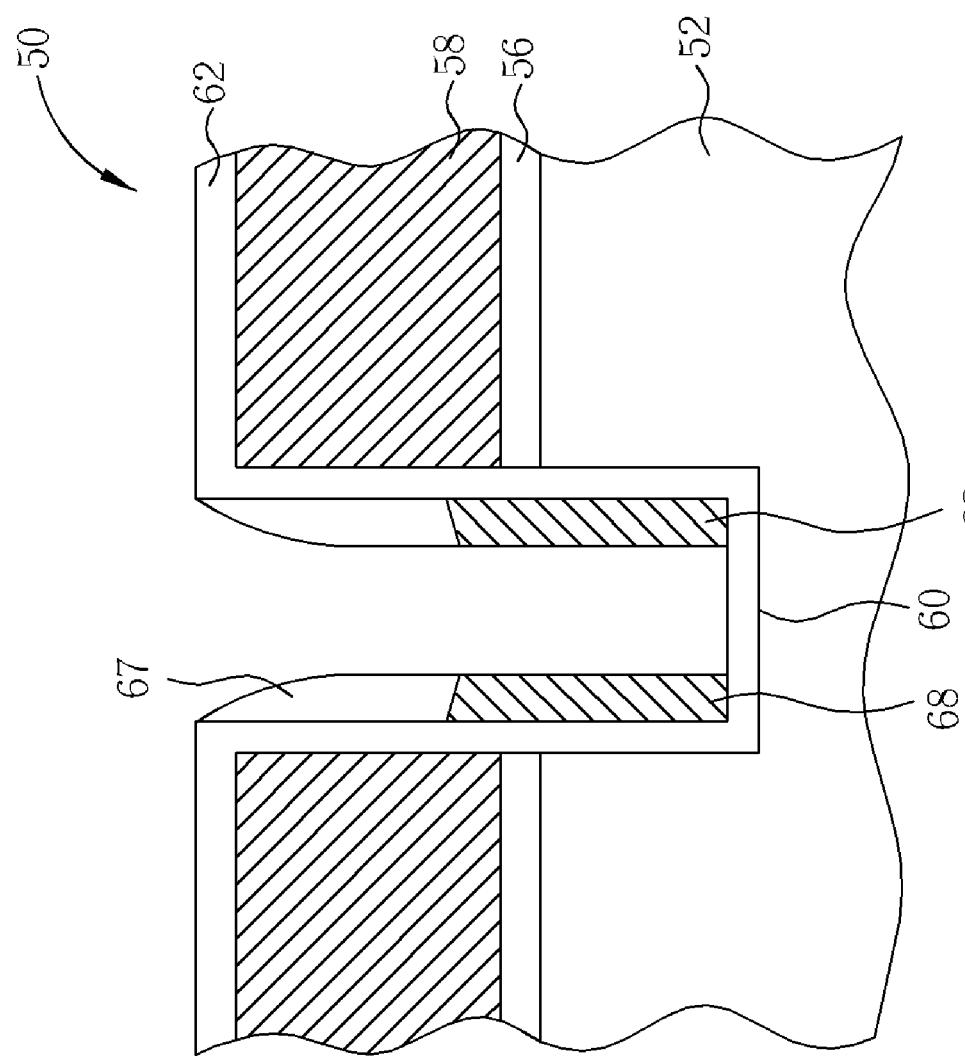
Figure 5:
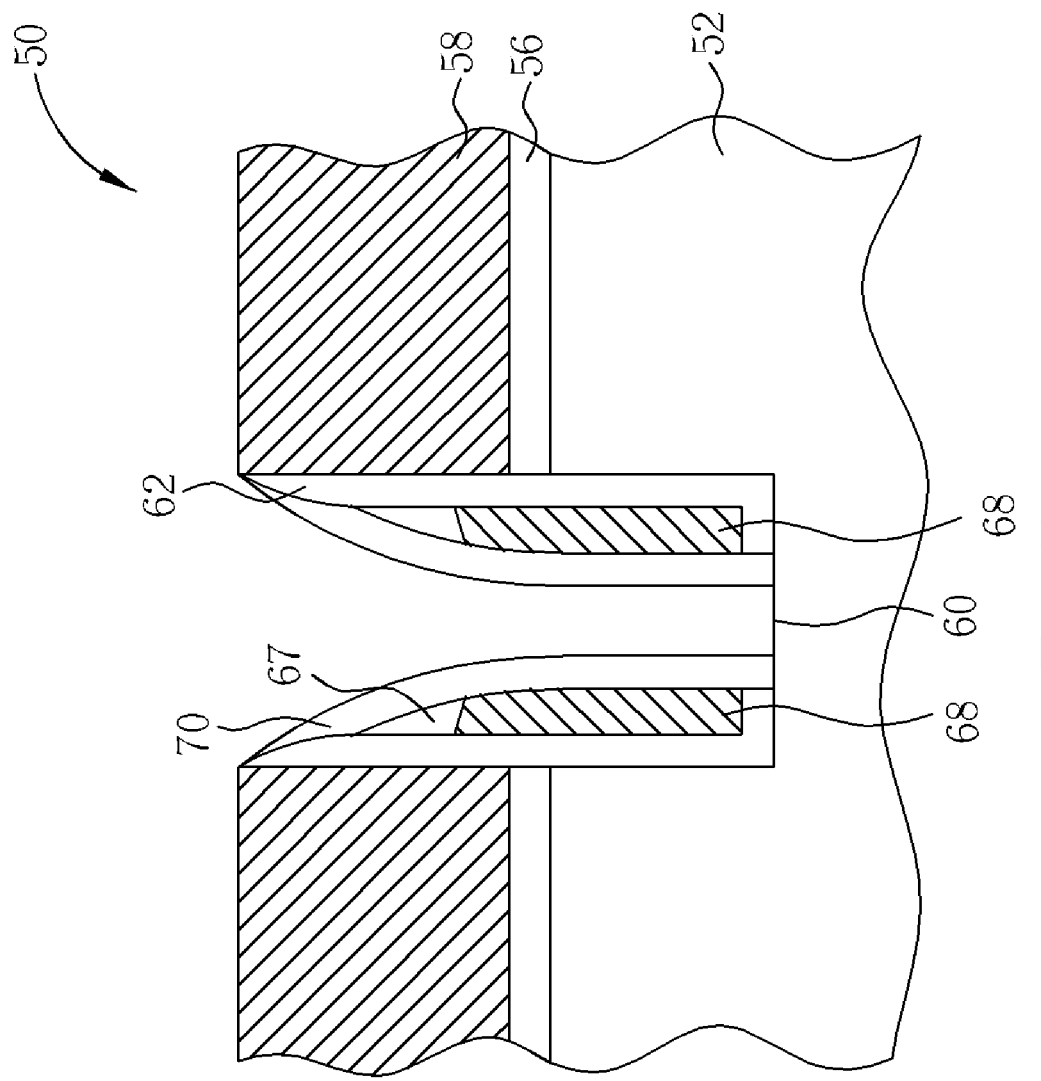

Then, as indicated in FIG. 3, a conductive layer 64, such as the conductive material containing polysilicon, is filled into the trench 60, and an etching back process is performed to remove a portion of the conductive layer 64 in order to make the top of the conductive layer 64 lower than the opening of the trench 60. In addition, a dielectric layer 66 is formed on the conductive layer 64 and the substrate 52. Please refer to FIG. 4. An anisotropic etching process is performed to remove a portion of the dielectric layer 66 in order to form two spacers 67. Then, these two spacers 67 are used as masks to remove partial conductive layer 64 until the tunnel oxide layer 62 on the bottom of the trench 60 is exposed. The remaining conductive layer 64 forms the floating gate 68 disposed on the sidewall of the trench 60. Referring to FIG. 5, an interlayer dielectric layer 70 is formed in the trench 60 to cover the floating gate 68. The material of the interlayer dielectric layer 70 may comprise silicon oxide, and its fabrication method may comprise performing a high-temperature thermal oxidation deposition process and then performing a rapid thermal annealing (RTA) process. The interlayer dielectric layer 70 may also be a composite dielectric layer which is formed with many layers of dielectric materials, such as silicon oxide/silicon nitride, silicon oxide/silicon nitride/silicon oxide, and so on.

Figure 6:
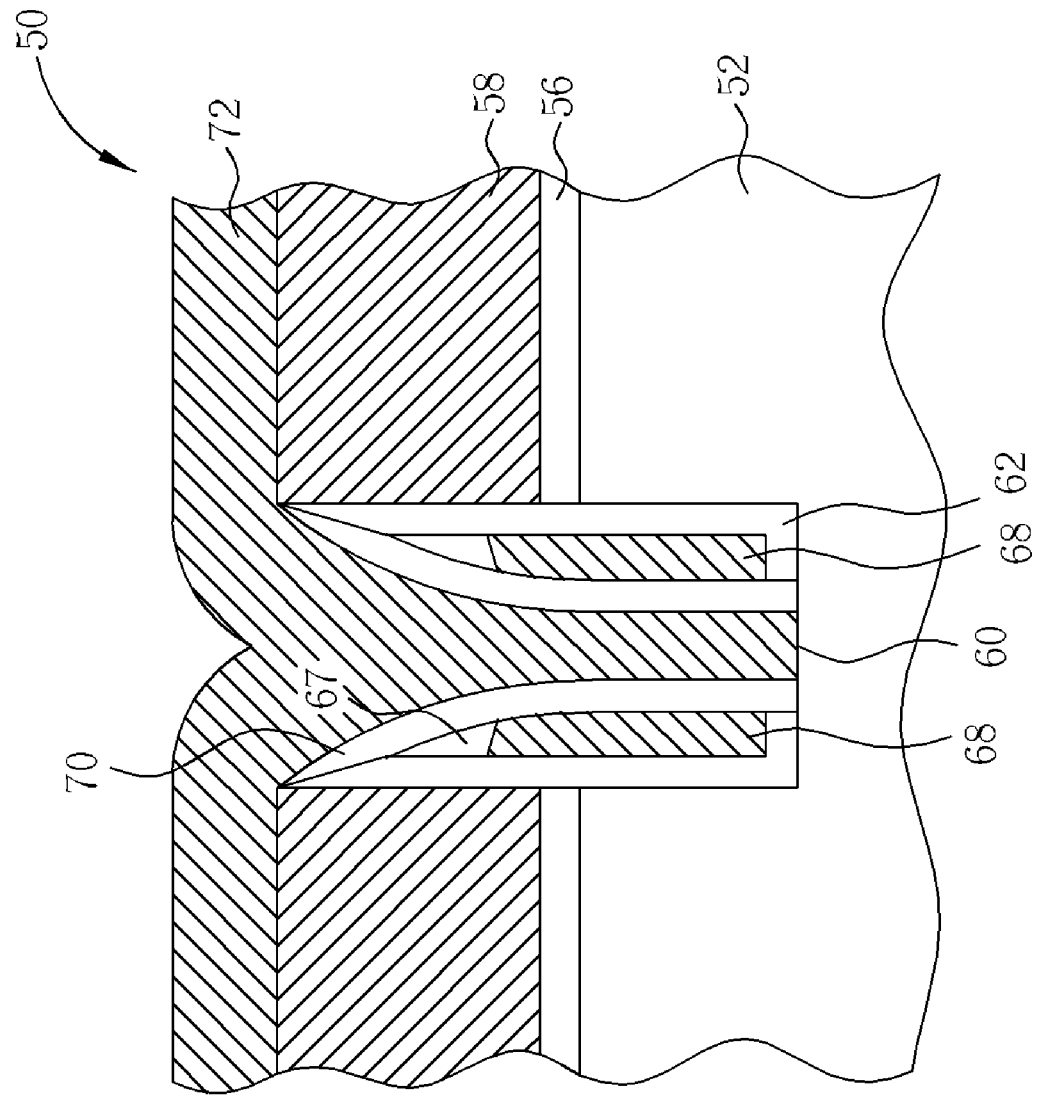
Figure 7:
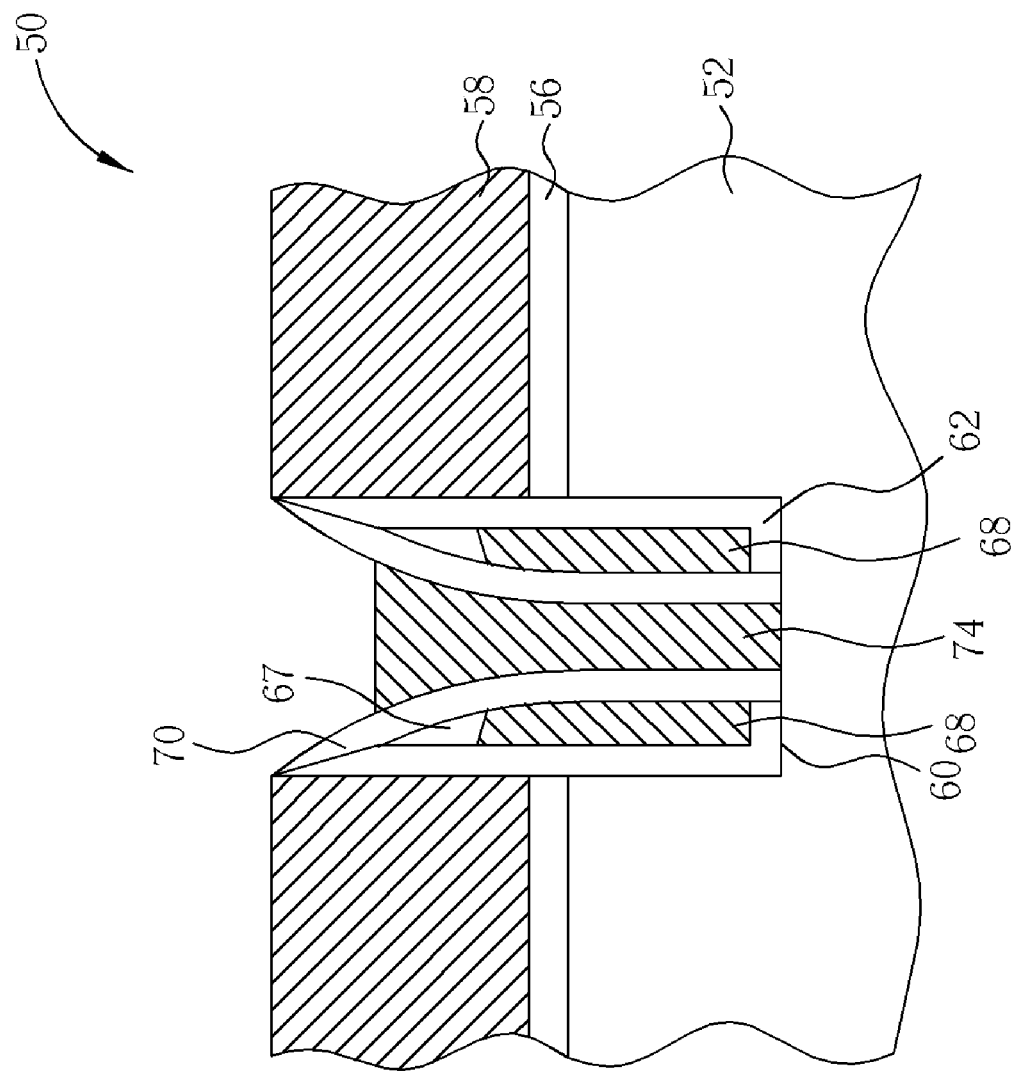

Please refer to FIG. 6. A conductive layer 72 is deposited on the substrate 52 and also filled into the trench 60. The conductive layer 72 may comprise polysilicon, metal, or other conductive materials. Then, an etching back process is performed to remove portions of the conductive layer 72 above the mask layer 58 and on the upper portion of the trench 60. The remaining conductive layer 72 becomes as a control gate 74 of the nonvolatile memory cell 50, as indicated in FIG. 7.

Figure 8:
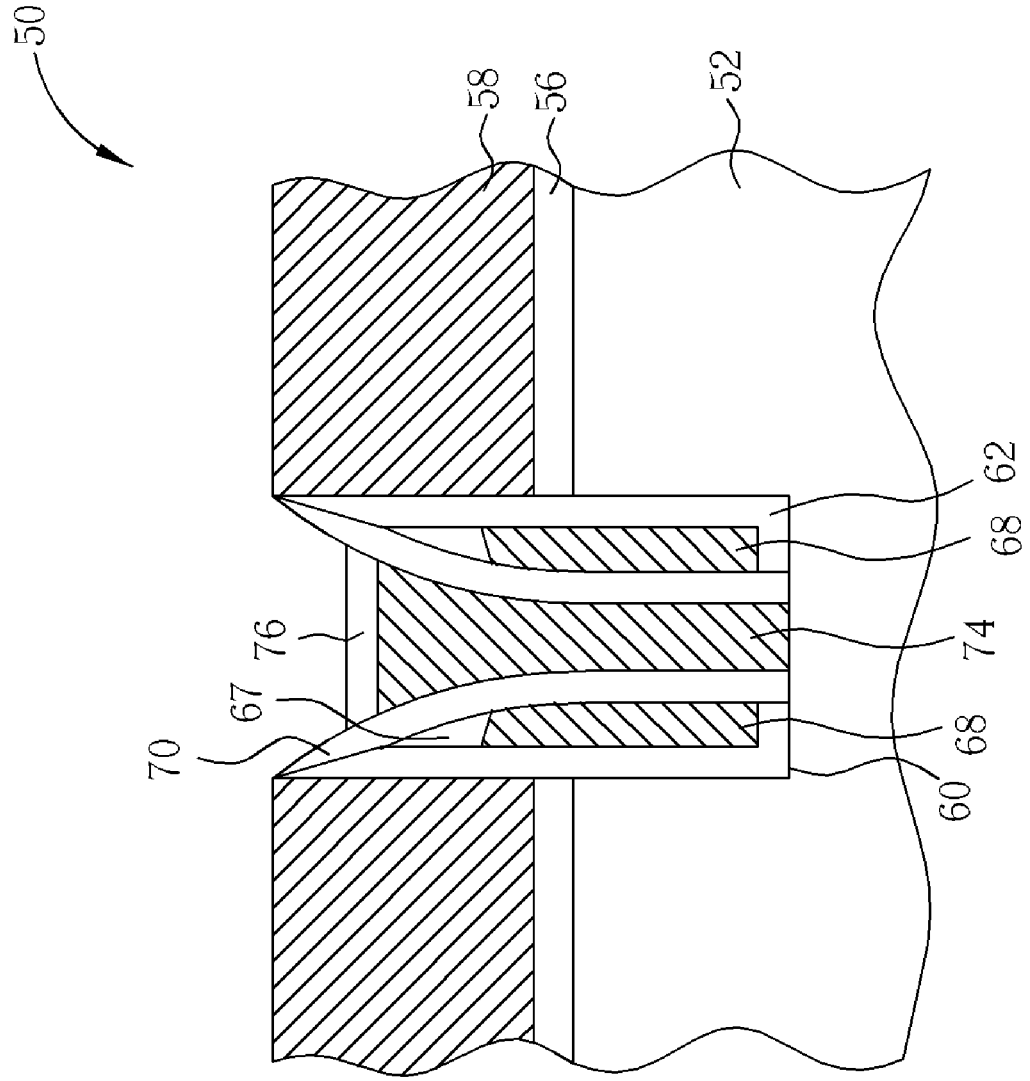
Figure 9:
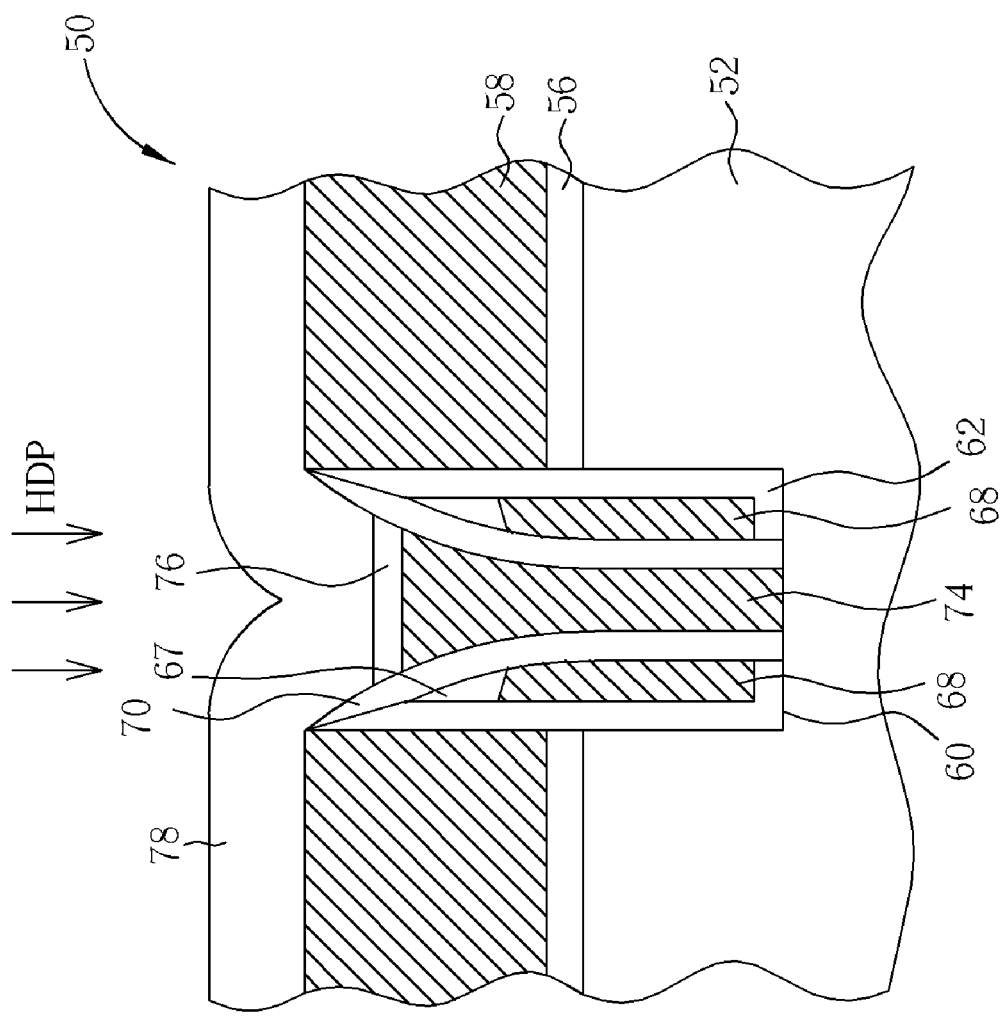

Subsequently, referring to FIG. 8, a low-temperature oxidation process is performed to form a thin oxide layer 76 on the top surface of the control gate 74, serving as a protect layer of the control gate 74. The preferred thickness of the oxide layer 76 is more than 50 Å, such as between about 50 Å to 100 Å. Then, as shown in FIG. 9, an HDP deposition process is carried out to form an HDP oxide layer 78 on the substrate 52 and the trench 60. The thickness of the HDP oxide layer 78 is about 2000 to 2500 Å.

In this embodiment, the oxide layer 76 is used to protect the control gate 74 underneath or other devices from damages caused by the bombarding during the HDP deposition process. Therefore, only a thickness of about 50 to 100 Å of the oxide layer 76 is needed to form on the top surface of the control gate 74. According to Table 1 as mentioned above, even if the critical dimension of the trench 60 is only 1350 Å, an oxide layer with a thickness of 435 Å is still able to grow on the control gate 74 through the low temperature oxidation process, which may, therefore, effectively protect the underneath control gate 74 during the following HDP deposition process.

Figure 10:
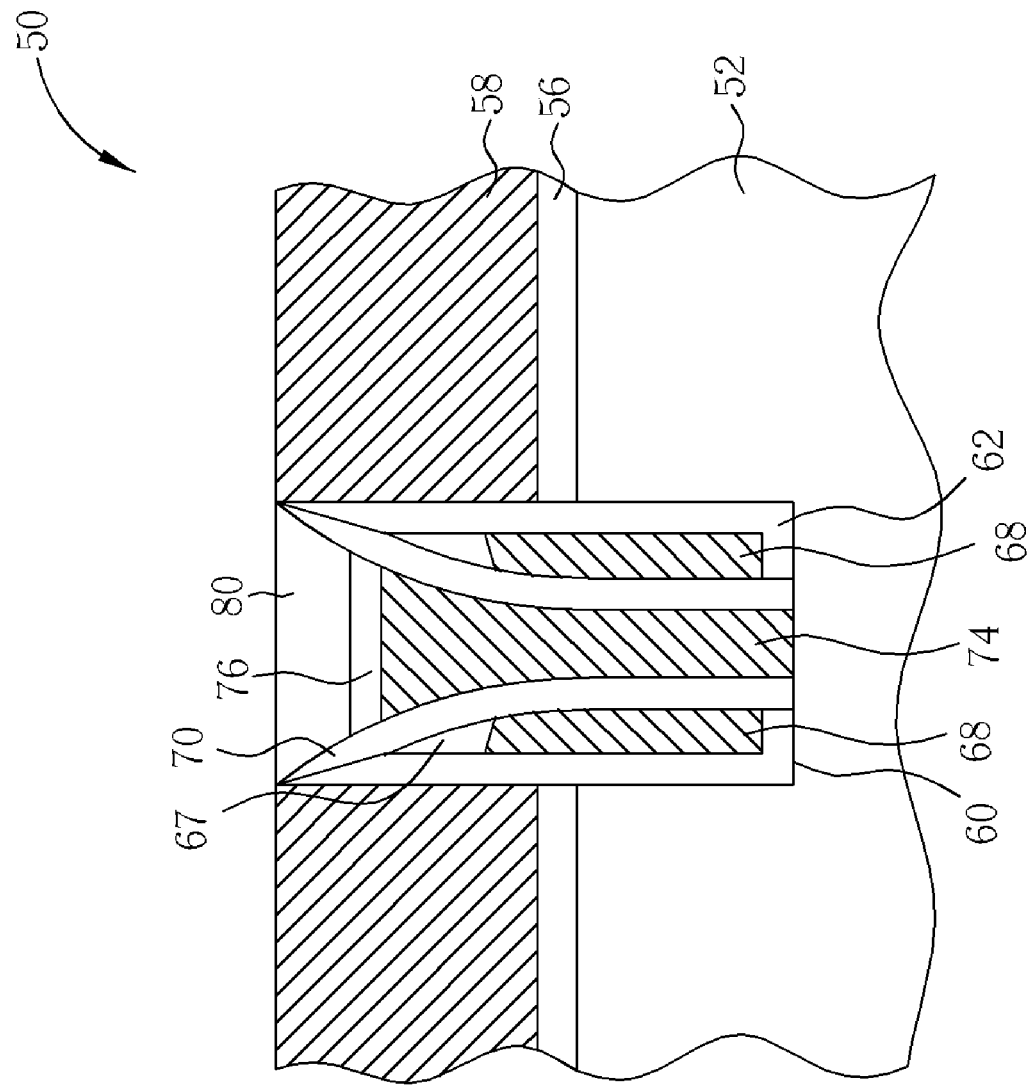
Figure 11:
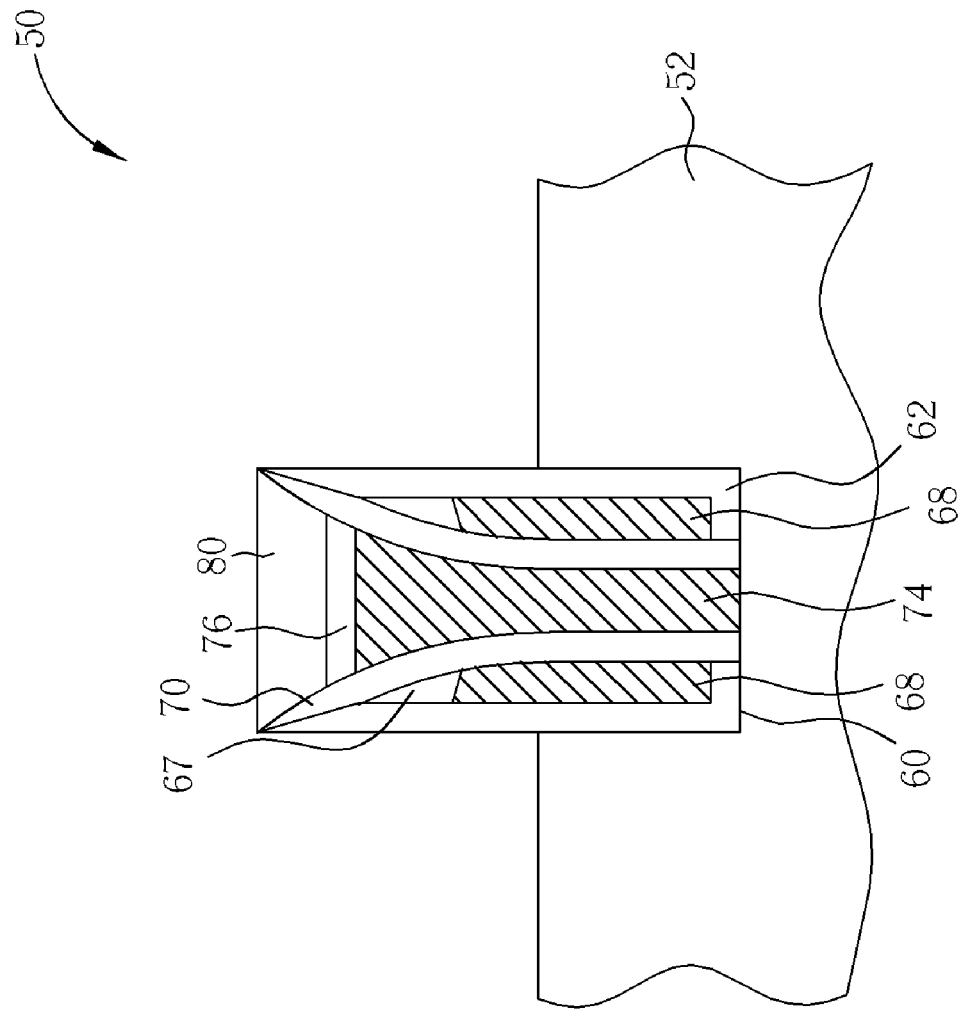

Please refer to FIG. 10. A portion of the HDP oxide layer 78 is removed to make the height of the surface of the remaining HDP oxide layer 78 approximately the same as the height of an opening of the trench 60 so as to form a cap layer 80 of the control gate 74. The method of removing the portion of the HDP oxide layer 78 may comprise an etching back process using the mask layer 58 as an etching stop layer, and before the etching back process, a planarization process such as a chemical mechanical polishing (CMP) process or coating a photoresist layer (not shown) on the substrate 52 may be performed. Then, the mask layer 58 and the pad layer 56 are removed to expose the tunnel oxide layer 62 which is originally in the trench 60, as shown in FIG. 11.

Figure 12:
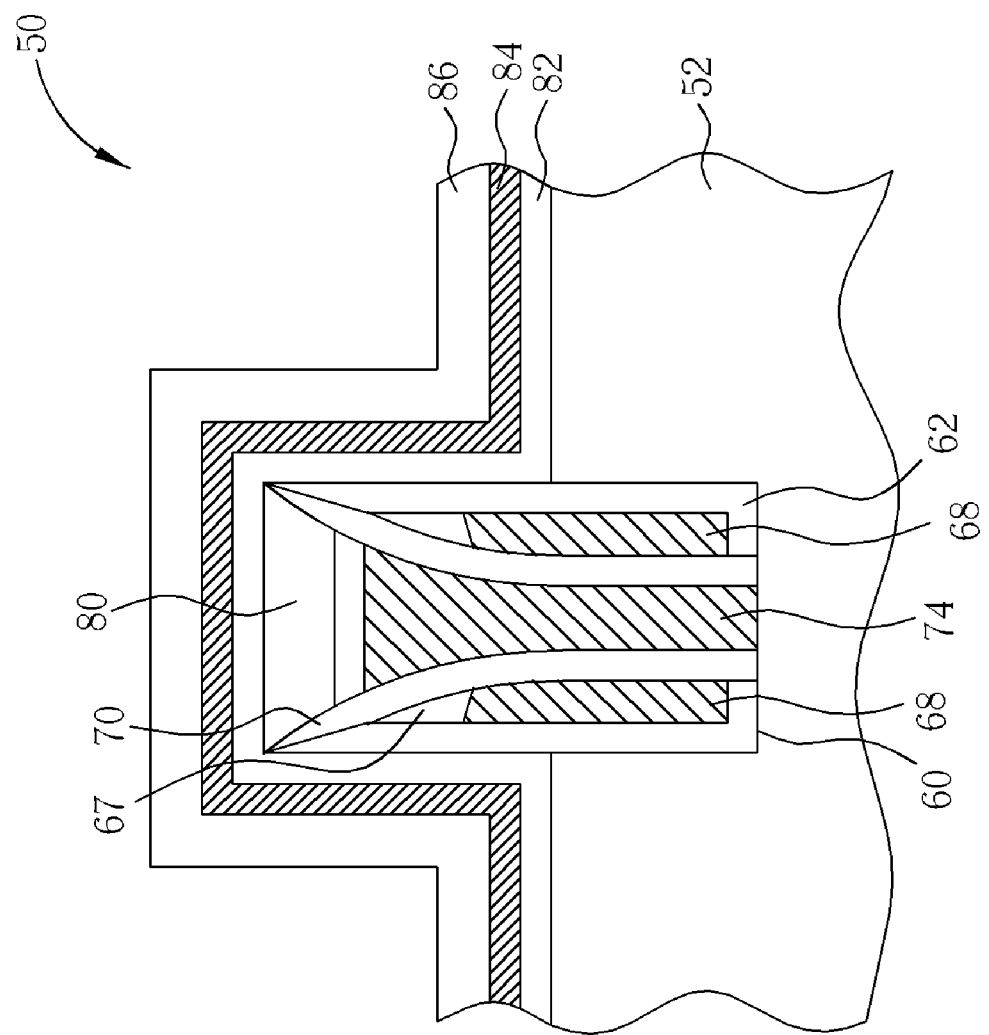
Figure 13:
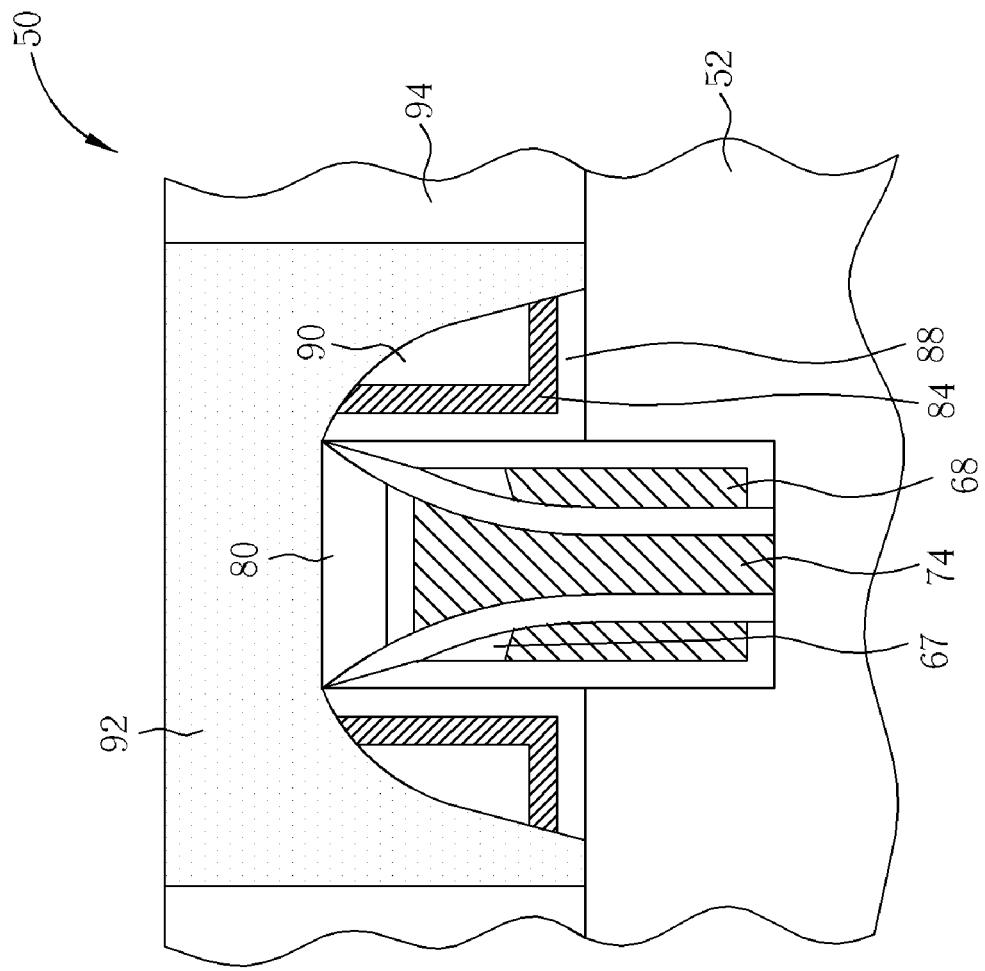

Please refer to FIG. 12. Subsequently a conductive layer 82, a metal silicide layer 84, and a nitride layer 86 are successively formed on the substrate 52. Then, an etching process is performed to form word lines 88 and spacers 90 on the outer sides of the floating gate 68, as shown in FIG. 13. Then, a dielectric layer 92 is formed on top of the substrate 52, and contact plugs 94 are fabricated within the dielectric layer 92 electrically connected to the source and drain (not shown) to complete the fabrication of the nonvolatile memory cell 50.

In contrast to the prior art, the present invention method utilizes an HDP deposition process to form the cap layer on the control layer, and therefore it is easy to control the HDP deposition process to form a cap layer with a required thickness to effectively isolate the control gate. According to the claimed invention method, a low-temperature thermal oxidation process is performed to form a thin oxide layer on the top surface of the control gate as a protection layer, an HDP deposition process is used to form an HDP oxide layer with a thickness more than 2000 Å on the protection layer, and an etching back process is used to remove a portion of the HDP oxide layer in order to form an ideal cap layer. Because the performance of the HDP deposition process is not limited by the size of the memory cell, the HDP deposition process is able to fabricate a cap layer with a satisfactory thickness. In addition, even if metal materials are used to replace the traditional polysilicon material for forming the control gate, a satisfactory cap layer can still be formed on top of the control gate according to the present invention method, thus the resistivity of the memory cell can be reduced. As a result, the present invention can meet the requirements of the process technology for smaller critical dimension and also fabricate nonvolatile memory cells with low resistivity and high quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a nonvolatile memory cell comprising:
    providing a substrate comprising a trench therein, and a tunnel oxide layer and a floating gate being successively formed on a sidewall of the trench;
    forming a control gate in the trench,
    performing a high density plasma (HDP) deposition process to form an HDP oxide layer on a top surface of the control gate, and
    removing a portion of the HDP oxide layer to make the height of the surface of the HDP oxide layer approximately the same as the height of an opening of the trench.

2. The method of claim 1, wherein the method further comprises forming a protection layer on the top surface of the control gate before performing the HDP process.

3. The method of claim 2, wherein the protection layer is formed through a low-temperature oxidation process.

4. The method of claim 2, wherein a thickness of the protection layer is about 50 to 100 angstroms (Å).

5. The method of claim 1, wherein the method of removing the portion of the HDP oxide layer comprises an etching back process.

6. The method of claim 1, wherein the thickness of the HDP oxide layer formed by the HDP deposition process is about 2000 to 2500 Å.

7. The method of claim 1, wherein the method of fabricating the trench comprises removing portions of the substrate and a mask layer formed thereon by a lithography and etching process.

8. The method of claim 7, wherein the method further comprises removing the mask layer to expose the tunnel oxide layer on the sidewall of the trench after forming the HDP oxide layer.

9. The method of claim 8, wherein the method further comprises successively forming at least a word line and a spacer on the substrate at outer side of the floating gate after removing the mask layer.

10. The method of claim 1, wherein the control gate comprises polysilicon or metal materials.

11. The method of claim 1, wherein the method further comprises forming an interlayer dielectric layer in the trench to cover the floating gate before forming the control gate.

12. The method of claim 11, wherein the interlayer dielectric layer comprises silicon oxide materials.

13. The method of claim 11, wherein the interlayer dielectric layer is a composite dielectric layer formed with multiple layers of dielectric materials.

* * * * *